(12) United States Patent
Liu et al.

(10) Patent No.: US 6,188,081 B1
(45) Date of Patent: Feb. 13, 2001

(54) FABRICATION PROCESS AND STRUCTURE OF THE METAL-INSULATOR-SEMICONDUCTOR-INSULATOR-METAL (MISIM) MULTIPLE-DIFFERENTIAL-RESISTANCE (MNDR) DEVICE

(76) Inventors: Wen-Chau Liu; Lih-Wen Laih, both of No. 1, Ta-Hsueh Rd., Tainan, Taiwan (TW)

( * ) Notice: Under 35 U.S.C. 154(b), the term of this patent shall be extended for 0 days.

(21) Appl. No.: 09/108,194

(22) Filed: Jul. 1, 1998

Related U.S. Application Data

(63) Continuation-in-part of application No. 08/761,976, filed on Dec. 11, 1996, now abandoned.

(51) Int. Cl.$^7$ ................................................. H01L 29/06
(52) U.S. Cl. .............................. 257/12; 257/14; 257/196; 257/201
(58) Field of Search .................................. 257/12, 14, 15, 257/17, 22, 23, 190, 191, 196, 200, 201

(56) References Cited

U.S. PATENT DOCUMENTS

| | | | |
|---|---|---|---|
| 5,302,838 | * | 4/1994 | Roenker et al. ...................... 257/14 |
| 5,489,786 | * | 2/1996 | Chow et al. ............................ 257/25 |
| 5,831,297 | * | 11/1998 | Liu et al. ............................... 257/200 |
| 5,869,845 | * | 2/1999 | Vander Wagt et al. ................ 257/25 |

* cited by examiner

Primary Examiner—Sara Crane
(74) Attorney, Agent, or Firm—Dougherty & Troxell

(57) ABSTRACT

The present invention is a fabrication process and structure of a negative-differential-resistance device characterized by triple negative-differential-resistance at room temperature and hexad negative-differential-resistance at a low temperature (−105° C.). The component parts are, from bottom upward, a substrate made of GaAs material, a first layer made of GaAs material, a second layer made of InGaAs ($In_xGa_{1-x}As$) material, a third layer made of AlGaAs material, and a metallic coating by vaporization on the third layer. Of the three layers, the second one is a varied layer composed of our successively varied laminates. The device, by utilizing the successive carriers accumulations of step-graded InGaAs subwells and the barrier lowering effect, provides MNDR properties and good potential for multiple-valued logic circuit applications.

8 Claims, 6 Drawing Sheets

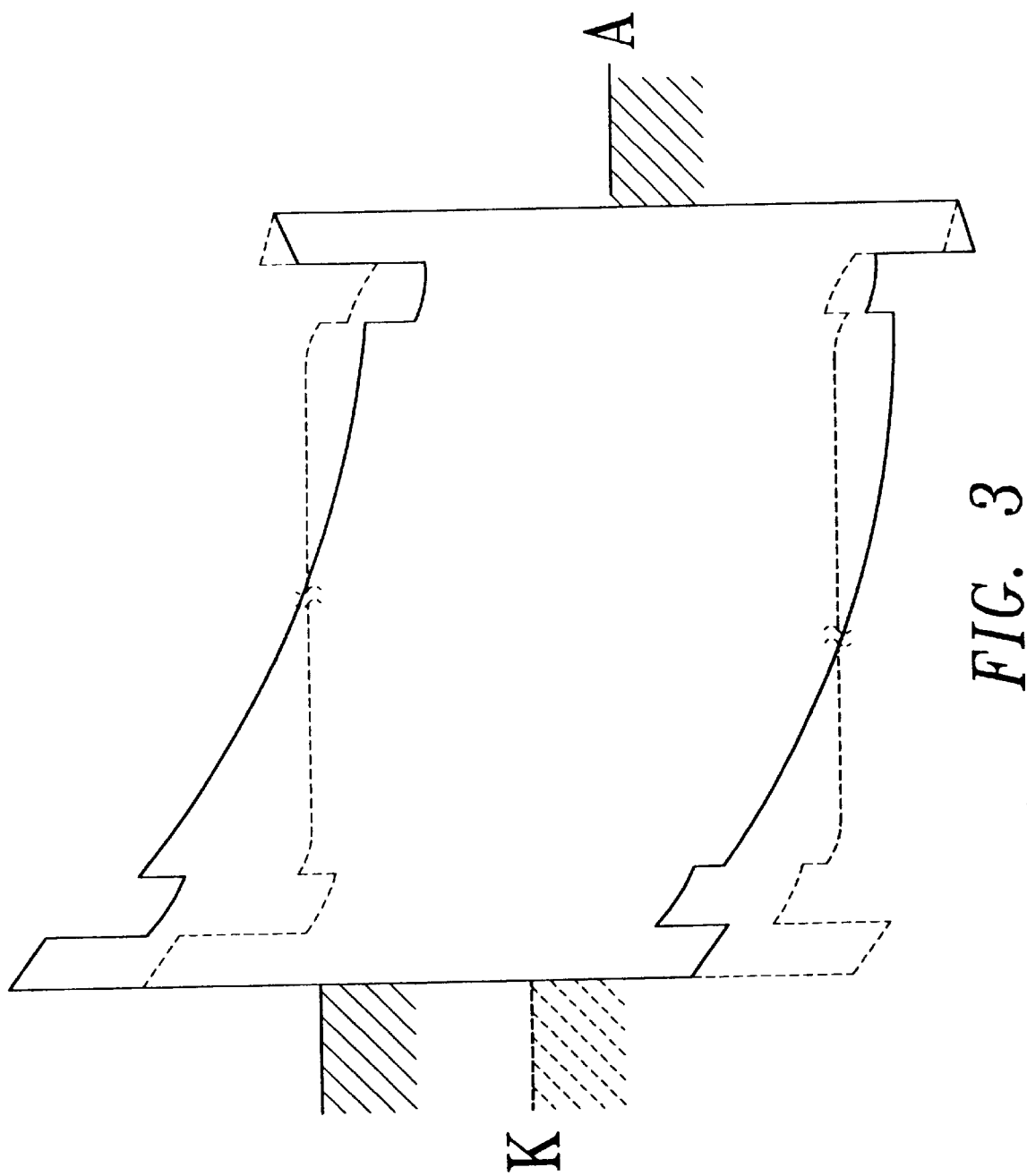

FABRICATION PROCESS AND STRUCTURE OF THE METAL-INSULATOR-SEMICONDUCTOR-INSULATOR-METAL (MISIM) MULTIPLE-DIFFERENTIAL-RESISTANCE (MNDR) DEVICE

RELATED APPLICATIONS

This application is a continuation-in-part (CIP) of U.S. Ser. No. 08/761,976 filed on Dec. 11, 1996, abandoned.

BACKGROUND OF THE INVENTION

1. Field of the Invention

The invention is one concerning the fabrication process and structure of multiple negative-differential-resistance (ENDR) device, especially those of triple negative-differential-resistance (NDR) properties at room temperature and hexed NDR behavior at a low temperature of −105° C.

2. Description of the Prior Art

The NDR performances have been widely used in electronic circuits as a switching device, a microwave device, and/or an oscillator. At the same time, it can also be used in multiple-valued logic circuits to speed up data processing. Nevertheless, ordinary NDR devices show, in general, only one NDR phenomenon which limits the scope of use in practical electronic circuits.

SUMMARY OF THE INVENTION

In view of the about, the inventor fabricated a metal-insulator-semiconductor-insulator-metal (MISIM) MNDR device. This device is a new type AlGaAs/InGaAs ($In_xGa_{1-x}$As)/GaAs metal-insulator (MNS) like MNDR switching device. By using the successive carriers accumulations at $In_xGa_{1-x}$As step-graded subwells and the potential barrier lowing effect, the interesting MNDR phenomena can be obtained in this device. Furthermore, owing the potential redistributed effect, three and six NDR behaviors are obtained at room temperature and low temperature, respectively. The presence of MNDR phenomena may provide multiple stable operation state and the circuit complexity in practical applications.

The purpose of this invention is to develop a new AlGaAs/$In_xGa_{1-x}$As)/GaAs MNDR switching device. From the successive carriers accumulations at $In_xGa_{1-x}$As step-graded subwells and potential redistribution effect, three and six NDR phenomena are obtained at room temperature and low temperature, respectively. These characteristics show a good potentiality in multiple-valued logic circuit application. They can simplify the circuit design, extend the application area of logic circuits, and reduce the complexity in circuit design. This shows signification well (QW) structure is mostly used in laser device and heterostructure field-effect transistor. This invention has it used in NDR devices which results in the extension use of QW structure.

BRIEF DESCRIPTION OF THE DRAWINGS

The invention, as well as its many advantages, may be further understood by the following detailed description and drawings in which:

FIG. 3 is a chart showing the energy band at on-state (dotted line) and that at flatband state (solid line) of MISIM MNDR device of the invention.

FIG. 5($b$) is a chart showing the current vs voltage characteristics of MISIM MNDR device of the invention at a low temperature (−105° C.).

DETAILED DESCRIPTION OF THE PREFERRED EMBODIMENT

Figure 1:
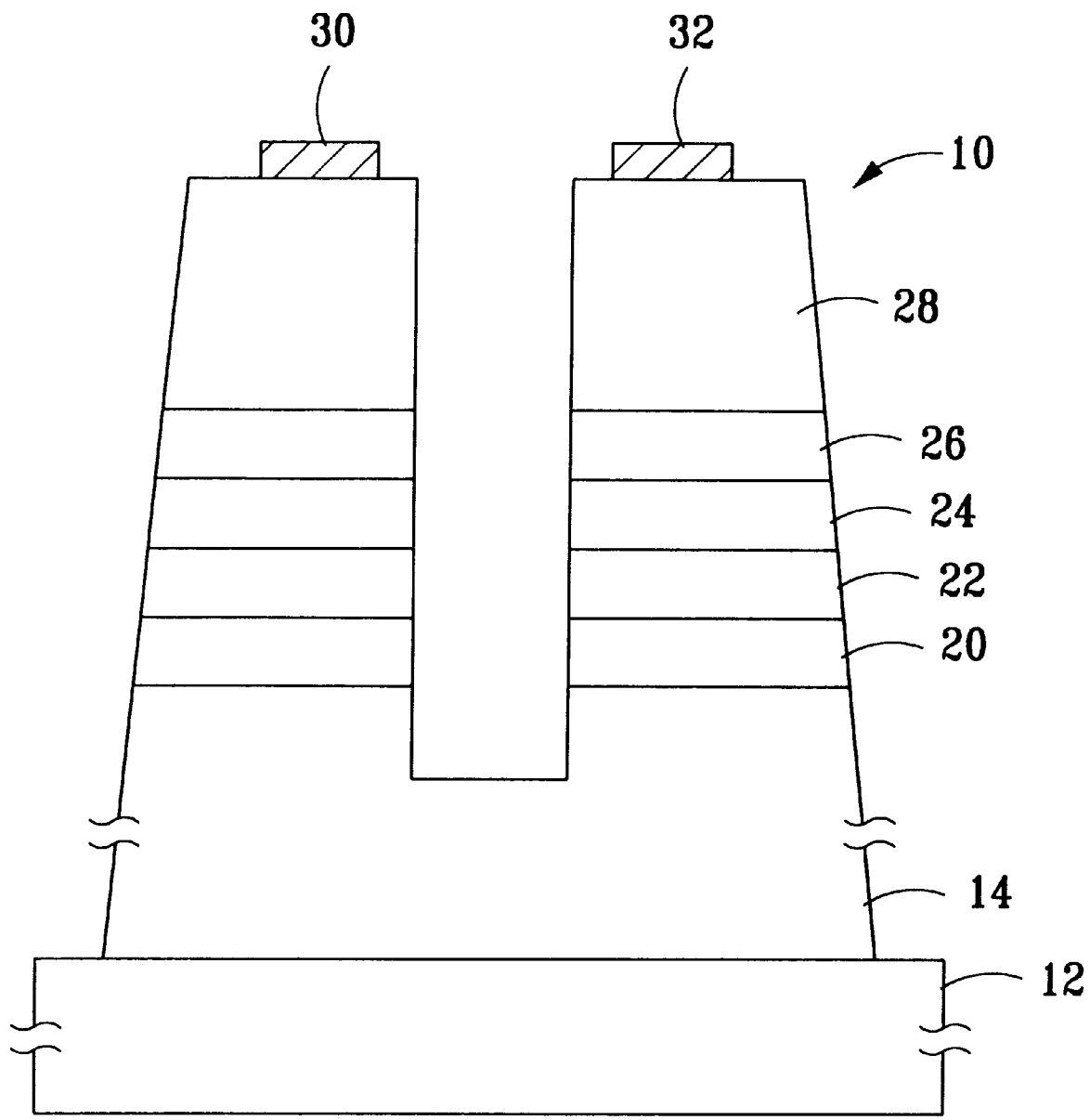
FIG. 1 is a longitudinal cross-sectional view showing the structure of MISIM MNDR device of the invention.

FIG. 1 presents one of the practical applications 10 of the present invention MISIM, in which the composition parts of the structure subsequently upward are a substrate 12 made of semi-insulating GaAs material, the first layer 14 formed by n⁻-doped GaAs material of thickness 0.5 $\mu$m, a four-laminated layer of four varying laminates 20,22,24, and 26 formed by n⁻-doped InGaAs material of thickness 50 Å each, wherein the mole ratios of indium vs gallium of the first, the second, the third and the fourth varied laminate are 5:95, 10:90, 15:85, and 20:80, respectively, the third layer 28 made of n⁻-doped AlGaAs material, an anode 32 made of element gold and a cathode 30, the space length between the anode and cathode being 10 $\mu$m. The doped concentration of the above n⁻-model semiconductors is all $1\times10^{16} cm^{-3}$.

Figure 2:
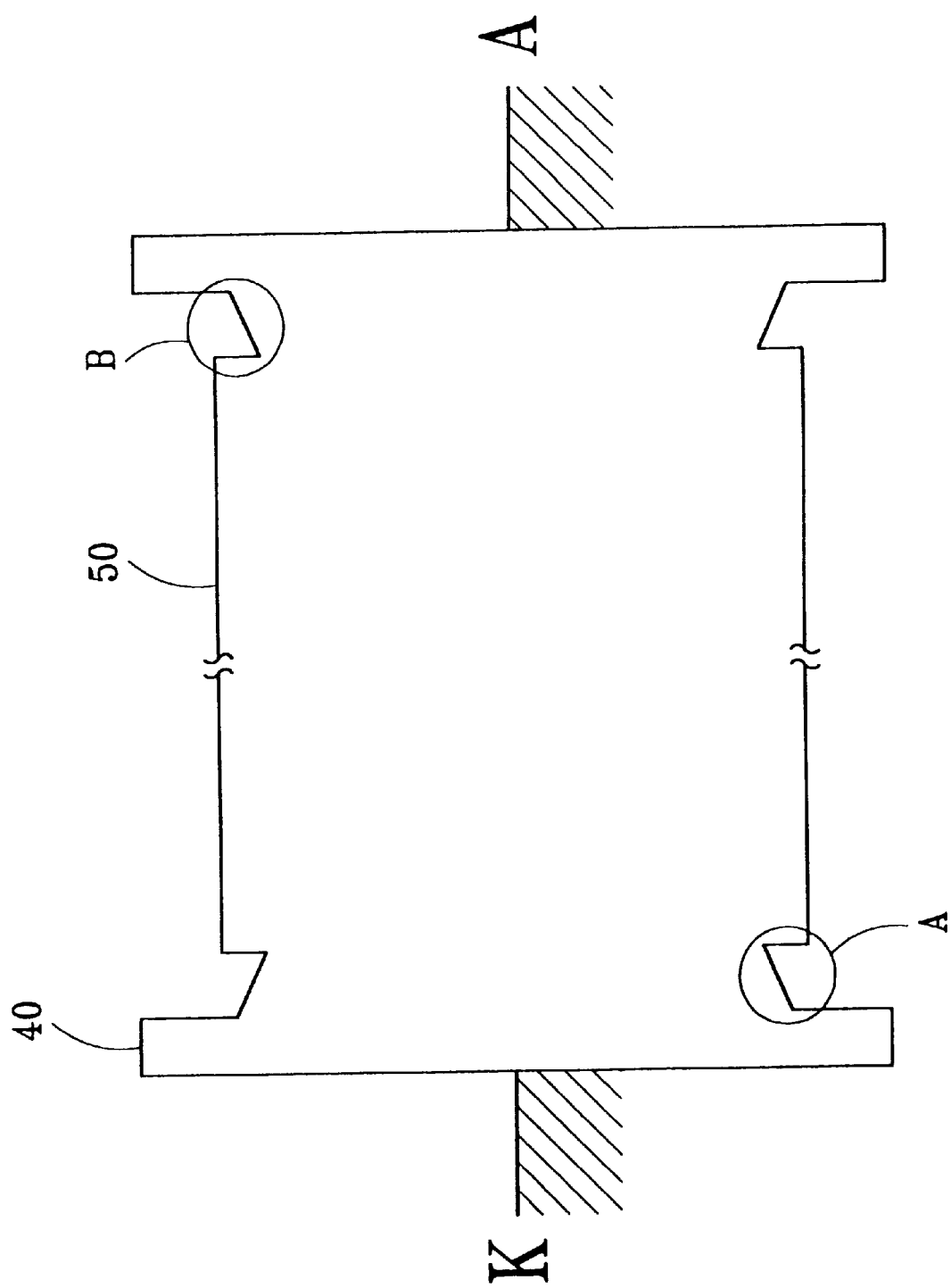
FIG. 2 shows the energy band at off-state of the MISIM MNDR device.
Figure 2A:
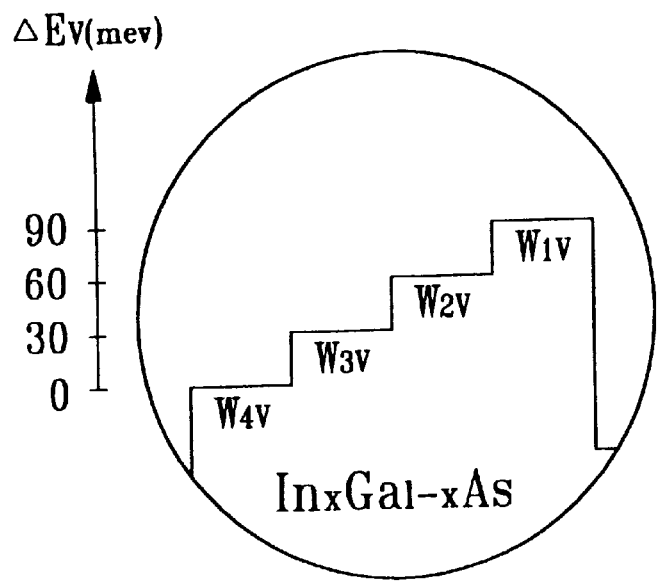
FIG. 2A is a chart showing the energy band of subwell formed in MISIM MNDR device of the invention owing to the conduction band discontinuity (ΔEv).
Figure 2B:
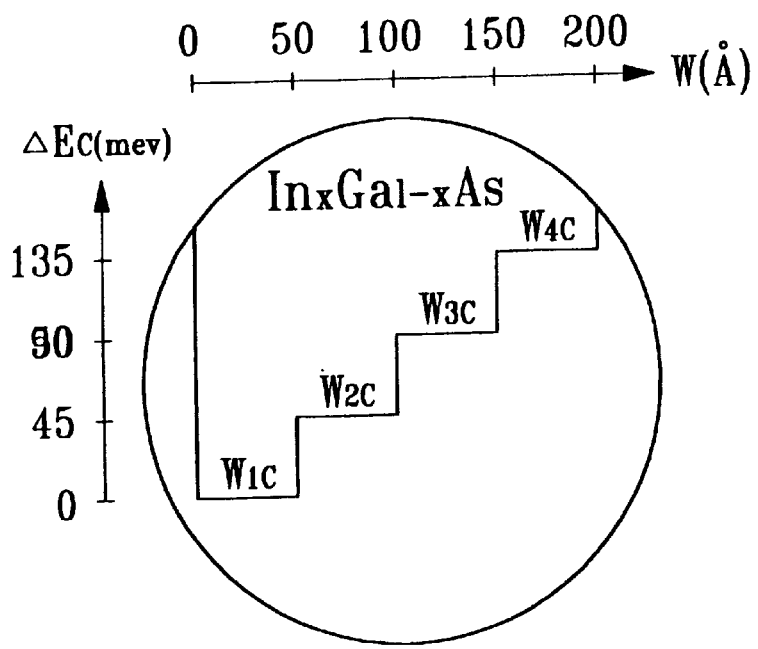
FIG. 2B. is a chart showing the energy band of subwell formed in MISIM MNDR device of the invention owing to the valence band discontinuity (ΔEc).

FIG. 2 illustrates the corresponding energy band diagrams. Due to the variation of In mole fraction x of ($In_xGa_{1-x}$As epitaxial layer ($0.05 \leq x \leq 0.2$), the discontinuities of conduction band (ΔEc) and valence band (ΔEv) are presented. This causes four subwells at InGaAs layer as shown in FIGS. 2(A) and 2(B). So, a step-graded InGaAs quantum well (QW) structure is found in the device.

Figure 4:
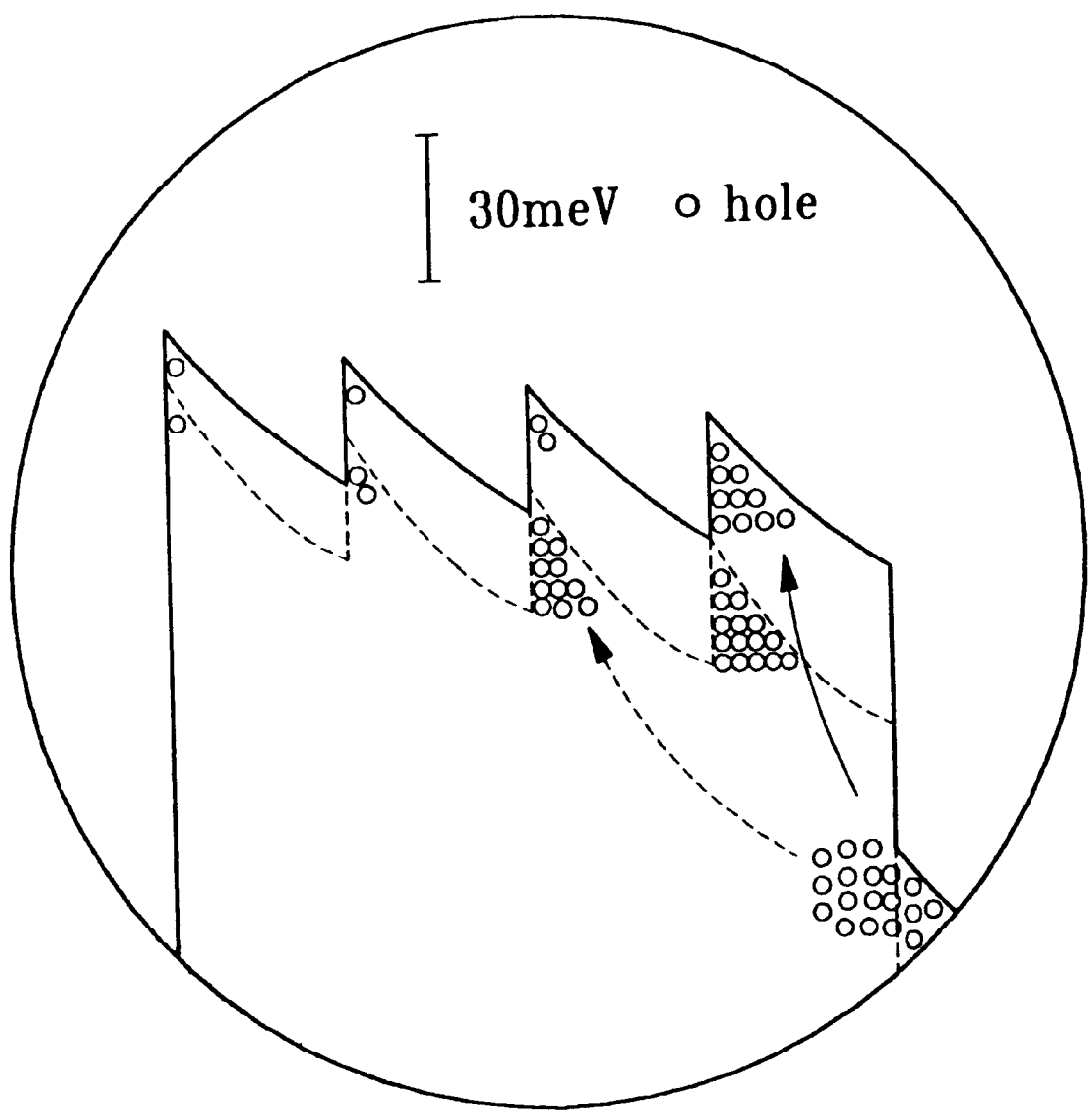
FIG. 4 is a chart showing the redistribution of potential energy is MISIM MNDR device of the invention caused by carriers accumulations.
Figure 5A:
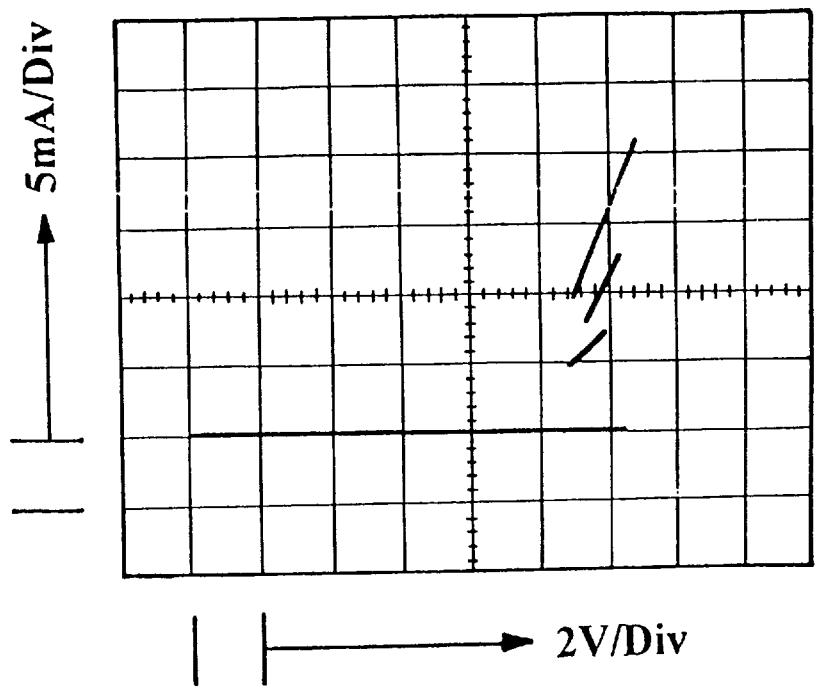
FIG. 5($a$) is a chart showing the current vs voltage characteristics is MISIM MNDR device of the invention at room temperature (27° C.).
Figure 5B:
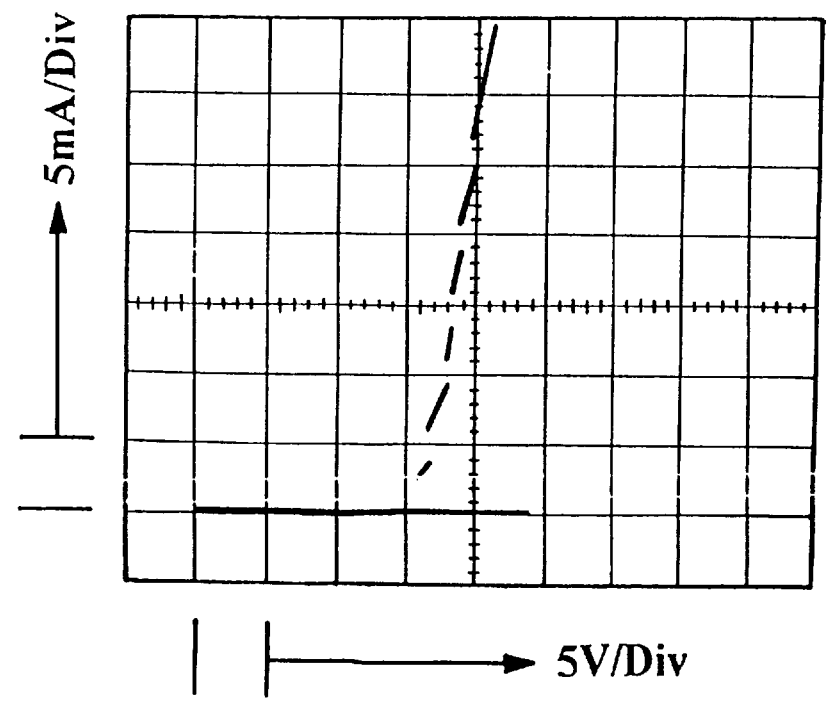

The experimental current-voltage characteristics of the device is shown in FIG. 5. Obviously, the triple-and hexad negative-differential-resistance (NDR) are observed at room temperature, and low temperature (−105° C.), respectively. The carrier transport mechanism can be described as follows: When a positive anode-to-cathode voltage $V_{ak}$ is applied. Most the of applied $V_{ak}$ voltage is across the deep depletion region of the reverse biased MIS structure near cathode side. At this time, the conduction current is negligible which presents the off-state of low current and large voltage, and the energy band is shown in FIG. 2. If the applied $V_{ak}$ voltage is sufficiently high, a flatband condition is reached as shown by the solid lines in FIG. 3. Beyond the point of flatband, most of the increase in voltage drop will be across the AlGaAs "insulator" of the forward biased MIS structure near anode side. This causes the significant increase of hold tunneling current via the forward biased MIS structure near anode side. Due to the presence of step-graded In mole fraction, a sawtooth-shaped potential profile in $In_xGa_{1-x}$As QW. Thus most of the holes traveling from anode toward cathode terminal tend to accumulate at the first subwell $W_{1v}$ of the InGaAs QW near cathode side, as indicated by the solid lines in FIG. 4. The accumulation of holes at subwell $W_{1v}$ yields the increase of field strength across AlGaAs "insulator" and enhances the electron tunneling current via MIS structure near cathode side. Similarly, many electrons tend to accumulate at the first subwell $W_{1c}$ of the InGaAs QW near anode side. With the increase of $V_{ak}$ voltage, this regenerative feedback action is enhanced. When $V_{ak}=V_s$, these carriers accumulations will cause the potential redistribution and barrier lowing effect. This may cause more carriers easily to transport over the potential barrier and the higher conduction current as indicated by the dotted-lines in FIG. 4. The high current and low voltage is an on-state of device operation. From the initial off-state to the on-state provides a switching behavior and a NDR phenomenon. This also can be seen in the first switching or NDR of the current-voltage characteristics in FIG. 5(*a*). Sequentially, the successive accumulations of holes at $W_{2v}$, $W_{3v}$, and $W_{4v}$ and electrons at $W_{2c}$, $W_{3c}$, and $W_{4c}$ subwells will result in the continuous barrier lowering and potential redistribution effects. These effects will cause the series switching and NDR phenomena. At low operative temperature, attributed to the small thermal energy, carriers accumulated at each InGaAs subwell are confined relatively effectively. Thus the obvious multiple-step switching or the staircase-shaped behaviors are acquired as shown in FIG. 5(*b*). At room temperature, the relative higher thermal energy causes the carriers confinement at some (more than one) subwells simultaneously. This certainly exhibits less barrier lowering and redistribution of potential and switching phenomena.

It is known that, from the about explanation, the MNDR of the device is caused by the successive carriers accumulations at step-graded InGaAs subwells and the barrier lowering and potential redistribution effects. Therefore, the NDR performances may be improved when a proper adjustment and design on device structure are employed. These performances may provide good potentials in the multiple-valued logic circuit design. Certainly, this is also helpful to the IC design and fabrication process.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

We claim:

1. A metal-insulator-semiconductor-insulator-metal (MISIM) multiple negative-differential-resistance (MNDR) device comprising:

a semi-insulating GaAs substrate, a first layer of an n-doped GaAs deposited on said substrate, a second layer of four-composition varied laminated layers of an n-doped InGaAS deposited on said first layer, to thereby form a step-graded InGaAs substrate thereon, a third layer of an n-doped AlGaAs on said second layer and a metallic cathode ad anode on and in contact with said third layer wherein the successive carriers formed in the step-graded OnGaAS sublevels in said second layer and the barrier-lowering effect bring about the MNDR effect.

2. A metal-insulator-semiconductor-insulator-metal (MISIM) multiple negative-differential-resistance (MNDR) device according to claim 1, wherein first layer has a thickness of 0.5 microns and a doped concentration of $1\times10^{16} cm^{-3}$.

3. A metal-insulator-semiconductor-insulator-metal (MISIM) multiple negative-differential-resistance (MNDR) device according to claim 1, wherein said second layer comprises four laminates which are successively varied in accordance with the In percentage of composition.

4. A metal-insulator-semiconductor-insulator-metal (MISIM) multiple negative-differential-resistance (MNDR) device according to claim 3, wherein said four composition-varied laminates in the second layer are all $n^-$-type InGaAs laminates with a thickness of 50 Å and doped concentration $1\times10^{16} cm^{-3}$ each, and the mole percentage ratios of In and Ga, in accordance with composition variations are 5:95, 10:90, 15:85 and 20:80 for the first, second, third and fourth laminate, respectively.

5. A metal-insulator-semiconductor-insulator-metal (MASIM) multiple negative-differential-resistance (BODR) device according to claim 1, wherein said third layer is an $n^-$-doped AlGaAs layer with a thickness of 200 Å and doped concentration of $1\times10^{16} cm^{-3}$.

6. A metal-insulator-semiconductor-insulator-metal (MSIM) multiple negative-differential-resistance (MNDR) device according to claim 5, wherein said third layer is made of AlGaAs, of which the mole percentage ratio of Al and Ga is 30:70.

7. A metal-insulator-semiconductor-insulator-metal (NUSIM) multiple negative-differential-resistance (MNDR) device according to claim 1, wherein said metallic cathode and anode are coated by vaporization on the upper surface of the third layer.

8. A metal-insulator-semiconductor-insulator-metal (MISIM) multiple negative-differential-resistance (MNDR) device according to claim 7, wherein said contact between the gold element and third layer is Schottky contact.

* * * * *